United States Patent
Amato et al.

(10) Patent No.: US 10,606,694 B2
(45) Date of Patent: Mar. 31, 2020

(54) ERROR CORRECTION USING HIERARCHICAL DECODERS

(71) Applicant: Micron Technology, Inc., Boise, ID (US)

(72) Inventors: Paolo Amato, Treviglio (IT); Marco Sforzin, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 15/958,496

(22) Filed: Apr. 20, 2018

(65) Prior Publication Data

US 2019/0324848 A1 Oct. 24, 2019

(51) Int. Cl.
| | | |
|---|---|---|
| *H03M 13/00* | (2006.01) | |
| *G06F 11/10* | (2006.01) | |
| *H03M 13/29* | (2006.01) | |
| *H03M 13/11* | (2006.01) | |

(52) U.S. Cl.
CPC ........ *G06F 11/1048* (2013.01); *G06F 11/102* (2013.01); *H03M 13/1128* (2013.01); *H03M 13/29* (2013.01)

(58) Field of Classification Search
CPC .. G06F 11/1048; G06F 11/102; H03M 13/29; H03M 13/1128
See application file for complete search history.

(56) References Cited

U.S. PATENT DOCUMENTS

| | | |
|---|---|---|
| 2008/0040647 A1 | 2/2008 | Zhidkow |
| 2009/0276689 A1 | 11/2009 | Tan et al. |
| 2011/0246853 A1 | 10/2011 | Kim et al. |
| 2012/0185744 A1* | 7/2012 | Varnica ............. H03M 13/1108 714/752 |
| 2015/0212945 A1 | 7/2015 | Jain et al. |
| 2017/0163287 A1 | 6/2017 | Parthasarathy et al. |

OTHER PUBLICATIONS

Amato et al., "Fast Decoding ECC for Future Memories", IEEE Journal on Selected Areas in Communication, vol. 34, No. 9, Sep. 2016, 12 pages.
International Search Report and Written Opinion from related international application No. PCT/US2019/025161, dated Jul. 25, 2019, 11 pages.

* cited by examiner

*Primary Examiner* — Samir W Rizk
(74) *Attorney, Agent, or Firm* — Brooks, Cameron & Huebsch, PLLC

(57) ABSTRACT

Apparatuses and methods related to correcting errors can include using fast decoding (FD) decoders and accurate decoding (AD) decoders. Correcting errors can include receiving input data from the memory array, performing a plurality of operations associated with an error detection on the input data, and providing, based on processing the input data, output data, a validation flag, and a plurality of parity bits to a second decoder hosted by a controller coupled to the memory device.

29 Claims, 2 Drawing Sheets

US 10,606,694 B2

ERROR CORRECTION USING HIERARCHICAL DECODERS

TECHNICAL FIELD

The present disclosure relates generally to memory, and more particularly, to apparatuses and methods associated with error correcting.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Various computing systems include processing resources that are coupled to memory (e.g., a memory system), which is accessed in association with executing a set of instruction (e.g., a program, applications, etc.). A memory system can use error correction codes (ECC) to detect and correct errors in data.

DETAILED DESCRIPTION

Figure 1:
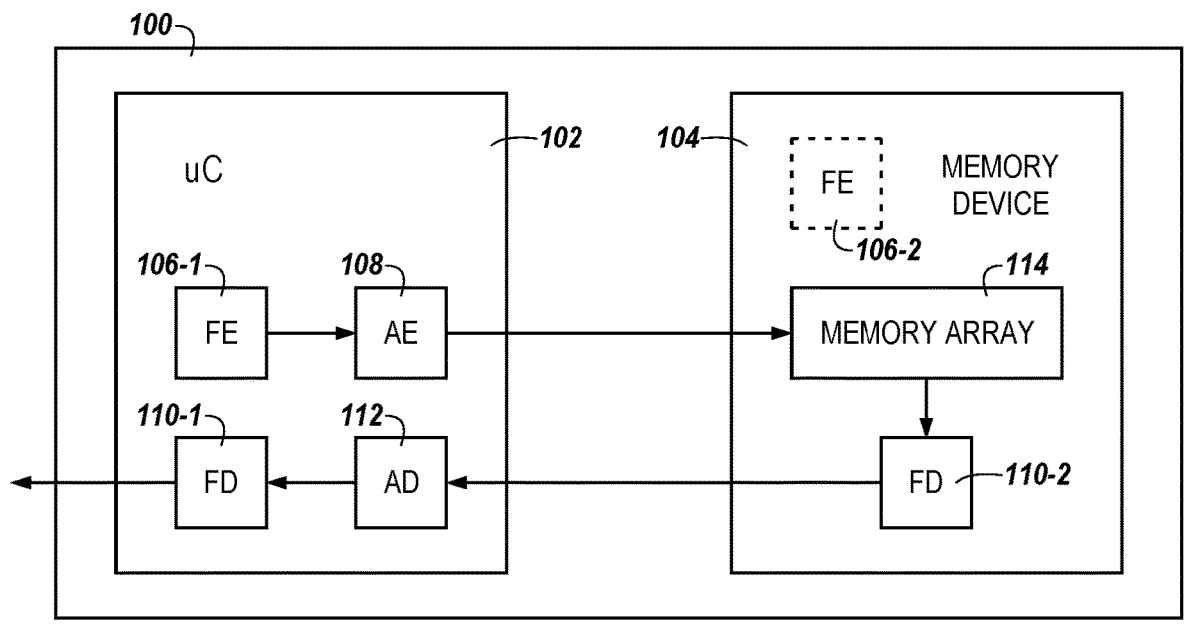
FIG. 1 is a block diagram of a memory system including a memory device and a controller capable of implementing a number of embodiments of the present disclosure.

The present disclosure includes apparatuses and methods related to error correcting. An example method can include receiving input data from the memory array, performing a plurality of operations associated with an error detection on the input data, and providing, based on processing the input data, output data, a validation flag, and a plurality of parity bits to a second decoder hosted by a controller coupled to the memory device.

A number of embodiments of the present disclosure can provide an improved error correction code (ECC) for performing error correct on data stored using a memory device. For instance, some prior ECCs include adding redundant data or parity data to a message such that the message can be recovered. The data can be recovered upon the instruction of a number of errors either during the transmission, storage, and/or retrieval of the data.

Storage has been a performance bottleneck in computer systems. The ability to store data and retrieve data from storage has been a limiting factor in the ability of a computer system to perform computations and operations.

Although NAND-based storage solutions have improved over hard drive latencies by more than 10×, storage has remained a latency laggard. Emerging memory (EM) technologies such as phase-change memory (PCM), magnetoresistive random access memory (MRAM), resistive random-access memory (ReRAM), and/or 3D XPoint memory may improve memory related latencies over other memory technologies. The EM can provide data storage that is as fast as the rest of the system (e.g., computing system). The EM can provide data storage that has a latency that is comparable to the latency of the other components of a computing system. To cope with reliability targets of storage applications, EM may utilize ECCs that are able to correct errors and retain the low-latency performance of a device hosting the EM.

Given that storage applications, unlike memory applications, can tolerate variable access latencies, it may be beneficial to utilize an ECC decoder with a low latency. In some examples, low latency can comprise a latency within the range of a plurality of nanoseconds. In other examples, a higher latency can be a latency within the range of a plurality of microseconds.

ECC decoders with a high correction capability and a low latency can be achieved by utilizing ECC concatenation schemes and hierarchical decoders. As used herein, hierarchical decoders can describe the use of multiple decoders to correct errors in data. Hierarchical decoders can include the use of fast decoding (FD) decoders and accurate decoding (AD) decoders. In some examples, a hierarchical decoding scheme can utilize FD decoders and can resort to more powerful ECCs used in AD decoders when needed.

ECCs employed in FD decoders can be used given the ability of FD decoders to flag its failures with a high probability. If the ECCs used in FD decoders fail without raising a flag, the information block would be accepted ending in an incorrect decoding event. In some examples, a failure without raising a flag may occur with a very low probability in FD decoders. The flag generated by the FD decoders to identify a failure may be produced in a very short time so as not to penalize the low-latency of the FD decoders.

In a number of embodiments, a hierarchical code architecture utilizes an FD decoder embedded in a memory device and an AD decoder implemented in a storage controller. To have an effective and efficient solution, the FD decoder architecture can be adapted for use in a hierarchical scheme as shown in FIG. 1.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of a memory system 100 including a memory device 104 and a controller 102 capable of implementing a number of embodiments of the present disclosure. The memory system 100 can also include a plurality of fast encoding (FE) encoders 106-1 and 106-2, referred to generally as FE encoders 106, and an accurate encoding (AE) encoder 108. The memory system 100 can also include plurality of FD decoders 110-1 and 110-2, referred to generally as FD decoders 110, and an AD decoder 112. The memory system 100 can further include a memory array 114.

As used herein, an "apparatus" can refer to, but is not limited to, a variety of structures or combinations of structures, such as a circuit or circuitry, a die or dice, a module or modules, a device or devices, or a system or systems. For example, the memory system 100, the controller 102, the memory device 104, the FE encoders 106, the AE encoder 108, the FD decoders 110, the AD decoder 112, and the memory array 114 may separately or collectively be referred to as an "apparatus".

In this example, a computing system includes a host coupled to the controller 102 which is coupled to the memory system 100. The computing system can be a laptop computer, personal computers, digital camera, digital recording and playback device, mobile telephone, PDA, memory card reader, interface hub, sensor, Internet-of-Things (IoT) enabled device, among other systems, and the host can include a number of processing resources (e.g., one or more processors) capable of accessing the memory system 100 (e.g., via the controller 102). The host may be responsible for execution of an operating system (OS) and/or various applications that can be loaded thereto (e.g., from the memory system 100 via the controller 102).

The controller 102 may receive memory transaction requests (e.g., in the form of read and write commands, which may be referred to as load and store commands, respectively) from the host. The controller 102 can transfer commands and/or data between the host and the memory system 100 over a number of interfaces, which can comprise physical interfaces such as buses, for example, employing a suitable protocol. Such protocol may be custom or proprietary, or interfaces may employ a standardized protocol, such as Peripheral Component Interconnect Express (PCIe), Gen-Z, CCIX, or the like. The controller 102 can comprise control circuitry, in the form of hardware, firmware, or software, or any combination of the three. As an example, the controller 102 can comprise a state machine, a sequencer, and/or some other type of control circuitry, which may be implemented in the form of an application specific integrated circuit (ASIC) coupled to a printed circuit board. In a number of embodiments, the controller 102 may be co-located with the host (e.g., in a system-on-chip (SOC) configuration). Also, the controller 102 may be co-located with the memory system 100.

The memory system 100 can comprise a number of physical memory "chips," or dice which can each include a number of arrays (e.g., banks) of memory cells and corresponding support circuitry (e.g., address circuitry, I/O circuitry, control circuitry, read/write circuitry, etc.) associated with accessing the array(s) (e.g., to read data from the arrays and write data to the arrays). As an example, the memory system 100 can include a number of DRAM devices, SRAM devices, PCRAM devices, RRAM devices, FeRAM, phase-change memory, 3DXpoint, and/or Flash memory devices. In a number of embodiments, the memory system 100 can serve as main memory for the computing system.

The FD decoders 110 can implement FD code. The FD code can correct errors in a duration of time. The duration of time can include a plurality of nanoseconds. An FD code and by extension the FD decoders 110 can correct at most a predetermined quantity of errors. For example, the FD decoders 110 can correct one to five errors in a given page of data retrieved from the memory array 114. The FD decoders 110 can implement an algebraic decoding scheme. That is, the FD decoders 110 can utilize algebraic decoding as oppose to iterative decoding. The FD decoders 110 can implement algebraic decoding utilizing combinatorial logic. In some examples, the FD decoders 110 can decode data with less than a $10^{-5}$ probably of incorrectly decoding data while maintaining a low latency.

The AD decoder 112 can implement AD code. The AD code can correct errors in a duration of time. The duration of time can include a plurality of microseconds. A predetermined duration of time can differentiate between the FD decoders 110 and the AD decoder 112. For example, the FD decoders 110 can determine whether to correct errors and/or can correct errors within a predetermined duration of time. The AD decoder 112 can determine whether to correct errors and/or can correct errors in a duration of time that is greater than the predetermined duration of time.

An AD code and by extension the AD decoder 112 can correct more than a predetermined quantity of errors. For example, the AD decoder 112 can correct six or more errors in a given page of data retrieved from the memory array 114. For example, the AD decoder 112 can correct hundreds of errors. The AD decoder 112 can implement an iterative process. The iterative process can be implemented utilizing sequential logic.

The AD decoder 112 and at least one of the FD decoders 110 can reside in different devices and/or apparatuses. For example, the AD decoder 112 can reside in the controller 102 while the FD decoder 110-2 resides in the memory device 104. In some embodiments, the controller 102 can be a micro controller (uC).

The FD decoder 110-2 can trigger the AD decoder 112 utilizing a validity flag. That is, the AD decoder 112 can determine whether to implement an AD code to correct errors in data responsive to receiving a validity flag and/or responsive to a value of the validity flag. The FD decoder 110-2 can trigger a validity flag based on whether the FD decoder 110-2 corrected an error or did not correct an error in data retrieved from the memory array 114. The triggered validity flag can represent a number of bits that include a predetermined value to identify that the FD decoder 110-2 corrected an error of that no error exists. The triggered validity flag can inhibit the data processing by the AD decoder 112.

In some examples, data stored in the memory array can also be encoded. The data can be encoded utilizing one of the FE encoders 106 and the AE encoder 108. For example, the data can be encoded utilizing the FE encoder 106-1 and the AE encoder 108 which reside in a same device (e.g., the controller 102). The data can also be encoded utilizing the FE decoder 106-2 and the AE encoder 108 which reside in different devices. The AE encoder 108 can be hosted by the controller 102 while the FE encoder 106-2 is hosted by the memory device 104.

In some embodiments, data and/or parity bits can be retrieved from the memory array 114 in pages. In some examples, the pages include code words. As used herein, parity bits describe bits that can be used to determine whether the data contains errors. The parity bits can also be used to identify the errors and/or correct the errors.

The data and/or the parity bits can be provided to the FD decoder 110-2. For example, the controller 102 can coordinate the transfer of the data and/or the parity bits from the memory array 114 to the FD decoder 110-2. The FD decoder 110-2 can determine whether errors exist in the data and/or whether it will correct the errors utilizing the parity bits. The FD decoder 110-2 can generate a validity flag based on whether the errors were corrected or whether the error were not corrected.

The FD decoder 110-2 can provide the data, the parity bits, and/or the validity flag to the AD decoder 112. The AD decoder 112 can determine whether to perform error-correcting codes (e.g., AD codes) on the data based on the value of the validity flag. For example, the AD decoder 112 can correct errors in the data responsive to receiving a validity flag comprising a first value. The AD decoder 112 can refrain from correcting errors responsive to receiving a validity flag comprising a second value. The FD decoder 110-2 can generate an activated validity flag responsive to correcting a number of errors in data. The activated validity flag can be a logical "1" bit and a deactivated validity flag can be a logical "0" bit. In some examples, the activated validity flag can be a logical "0" bit and a deactivated validity flag can be a logical "1" bit.

The AD decoder 112 can correct errors responsive to receiving a deactivated validity flag. That is, the AD decoder 112 can determine whether an error exists in the received data responsive to receiving a deactivated validity flag. The AD decoder 112 can correct the error responsive to determining that the error exists.

If the AD decoder 112 corrects errors in the data using the parity bits, the AD decoder 112 can provide the corrected data to the FD decoder 110-1 for further error correction. In some examples, the AD decoder 112 can provide the data to a requesting apparatus without further processing by the FD decoder 110-1.

In other examples, the AD decoder 112 can provide the input data as the output data without performing error correction on the data responsive to receiving an activated validity flag. That is, the AD decoder 112 can pass the data and/or the parity bits to the FD decoder 110-1 and/or a requesting apparatus responsive to receiving data that has been corrected by the FD decoder 110-2.

In some examples, the AD decoder 112 can receive data and the validity flag from the FD decoder 110-2 without receiving the parity bits. The AD decoder 112 can determine whether an error exists in the data. Responsive to determining that an error exists in the data, the AD decoder 112 and/or the controller 102 can request the parity bits from the memory device 104. For example, the AD decoder 112 can request the parity bits using a read retry command. The AD decoder 112 and/or the controller 102 can request the parity bits from the memory device 104 using the read retry command.

The AD decoder 112 corrects the errors using the requested parity bits. The requested parity bits may be received from the FD decoder 110-2 and/or may be received without the use of the FD decoder 110-2. In some examples, the FD decoder 110-2 can provide the parity bits using one or more dedicated parity bits lines.

The FD decoder 110-1 can receive data from the AD decoder 112 and can correct errors in the data. For example, the FD decoder 110-1 can determine whether the data provided by the AD decoder 112 contains errors. Responsive to determining that the data contains errors, the FD decoder 110-1 can correct the errors.

Figure 2:
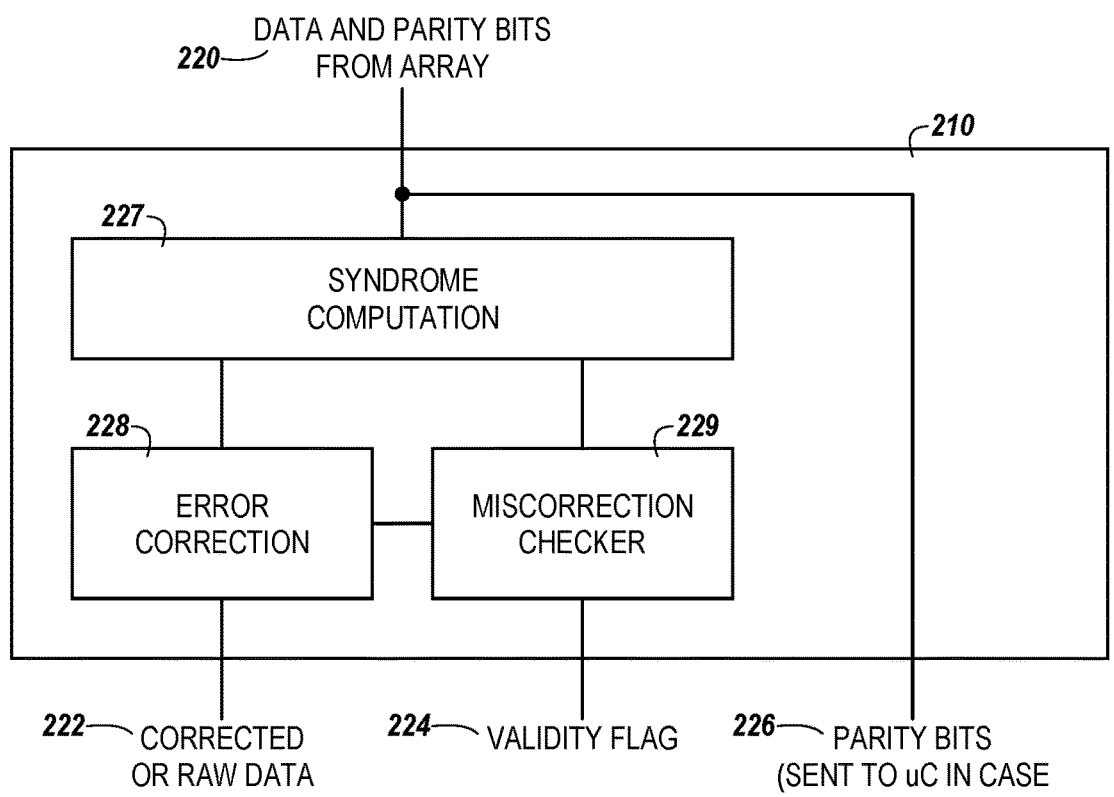
FIG. 2 is block diagram of a fast decoding (FD) decoder capable of correcting errors in accordance with a number of embodiments of the present disclosure.

FIG. 2 is block diagram of a FD decoder 210 capable of correcting errors in accordance with a number of embodiments of the present disclosure. The FD decoder 210 can include a syndrome computation unit 227, an error correction unit 228, and a miscorrection checker unit 229.

In some embodiments, the syndrome computation unit 227 can communicate with the error correction unit 228 and/or the miscorrection checker unit 229. The miscorrection checker unit 229 can also communicate with the error correction unit 228.

The FD decoder 210 can receive data 220 and the parity bits 226 from the memory array. The FD decoder 210 can receive the data 220 at the syndrome computation unit 227. The FD decoder 210 can provide the parity bits 226 via a dedicated parity bits line to a controller and/or an apparatus of the controller.

In some examples, the FD decoder 210 can provide the parity bits 226 regardless of whether the data is corrected or the data is not corrected (e.g., raw data). In other examples, the FD decoder 210 can provide the data if the validity flag 224 is deactivated (e.g., invalidity). The FD decoder 210 can also provide the parity bits 226 upon request. For examples, the FD decoder 210 may provide the parity bits 226 upon request regardless of a value of the validity flag 224.

The syndrome computation unit 227 can generate a syndrome from the data 220 and the parity bits 226. A syndrome can be a vector that can be used to determine whether there are errors in the data 220. For examples, the syndrome computation unit 227 can generate a syndrome from one or more codewords received. The syndrome can be provided to the error correction unit 228 and/or the miscorrection checker unit 229.

The error correction unit 228 can utilize the syndrome to determine whether the data 220 includes errors. The error correction unit 228 can also use the syndrome to determine a quantity of errors present in the data 220. If the quantity of errors in the data 220 is less than a predetermined threshold, then the error correction unit 228 can correct the errors. If the quantity of errors in the data 220 is greater than the predetermined threshold, then the error correction unit 228 may abstain from correcting the errors. As such, the error correction unit 228 can generate corrected data or raw data. The data provided by the error correction unit may be referenced as data 222, corrected data 222, and/or raw data 222. The FD decoder 210 can provide the data 222 to a controller and/or the AD decoder hosted by the controller. In some examples, the error correction unit 228 can provide a message to the miscorrection checker unit 229 to inform the miscorrection checker unit 229 whether an error was corrected in the data 222.

The miscorrection checker unit 229 can determine using the syndrome and/or a message received from the error correction unit 228 whether an error was corrected in the data 222. Based on whether an error was corrected in the data 222, the error correction unit 228 can generate a validity flag 224. The miscorrection checker unit 229 can generate an activated validity flag 224 if the data 222 comprises corrections for errors in the data 220. The miscorrection checker unit 229 can generate a deactivated validity flag 224 if the data 222 does not comprise corrections. The miscorrection checker unit 229 can provide the validity flag 224 to a controller and/or the AD decoder hosted by the controller.

In some examples, the FD decoder 210 can provide the data 222, the validity flag 224, and the parity bits 226 to the controller regardless of whether the data 222 includes corrections. In other examples, the FD decoder 210 can provide the data 222 and the validity flag 224 to the controller regardless of whether the data 222 contains corrections. The FD decoder 210 can provide the parity bits 226 to the controller if the data 222 does not contain corrections.

Figure 3:
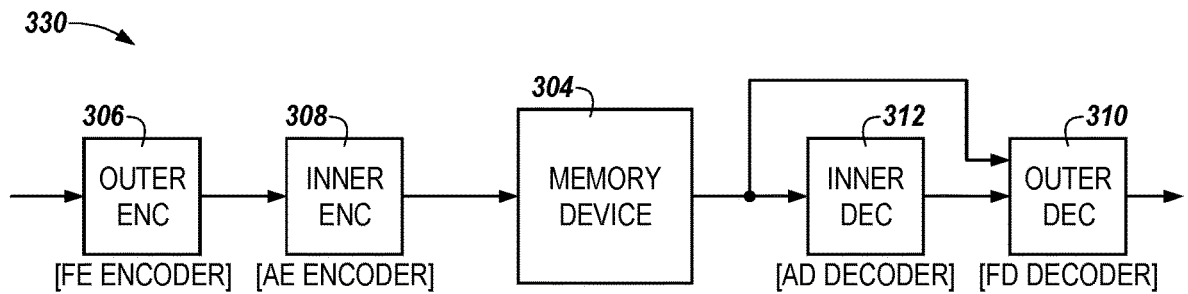
FIG. 3 illustrates a flow chart associated with correcting errors utilizing an FD decoder and an accurate decoding (AD) decoder in accordance with a number of embodiments of the present disclosure.

FIG. 3 illustrates a flow chart 330 associated with correcting errors utilizing an FD decoder and an AD decoder in accordance with a number of embodiments of the present disclosure. FIG. 3 includes an outer encoder 306, an inner encoder 308, a memory device 304, an inner decoder 312, and an outer decoder 310. FIG. 3 show serial code concatenation using an outer FD code.

The outer encoder 306 can be a FE encoder, the inner encoder 308 can be an AE encoder. The inner decoder 312 can be an AD decoder and the outer decoder 310 can be an FD decoder. Although not shown, the memory device 304 can include an FD decoder. The inner decoder 312 and the outer decoder 310 can be hosted by a controller. In some examples, the outer encoder 306 and the inner encoder 308 are hosted by the controller.

The validity flag and the data generated by the FD decoder hosted by the memory device 304 can be used to determine whether the data is provided to the inner decoder 312 and/or the outer decoder 310. For example, the FD decoder hosted by the memory device 304 can provide raw data to the inner decoder 312 responsive to generating a validity flag with a predetermined value such as a logical "0" indicating that the data is uncorrected (e.g., raw). The FD decoder hosted by the memory device 304 can provide corrected data to the inner decoder 312 responsive to generating a validity flag with a predetermined value such as a logical "1" indicating that the data is corrected.

The outer encoder 306 can encode small chunks of data (e.g., raw data) to generate fast codewords. The fast codewords can be encoded using the inner encoder 308 to generate accurate codewords. The accurate codewords can be referred to as an accurate code. The accurate code can be a systematic code. That is, the accurate code can separate data and parity bits.

In a decoding phase, the inner decoder 312 can decode the accurate code to generate the fast codewords. The outer decoder 310 can decode the fast codewords to generate that small chunks of data. Utilizing the outer decoder 310 after the inner decoder 312 can increase the error correction capacity of a system implementing the flow chart 330.

That is, the outer decoder 310 can eliminate possible error floors. The outer decoder 310 can be used to provide better performance over the inner decoder 312. In some examples, the inner decoder 312 and the outer decoder 310 can operate on chunks of data of different sizes. For example, the small chunks of data can be a first size and the accurate codewords can be a second size, where the second size is greater than the first size.

The duplication of the FD decoder is made possible due to the systematic nature of the accurate code. The duplication of the FD decoder refers to the use of an FD decoder in the memory device 304 and the use of the outer decoder 310. Due to the systematic nature of the accurate code, the FD decoder in the memory device 304 can be provided an opportunity to correct errors before the inner decoder 312 and/or the outer decoder 310 is provided an opportunity to correct errors.

Although the example in FIG. 3 is shown using a serial code concatenation, the examples described herein can be extended to serial or parallel concatenation using an inner FD code.

Figure 4:
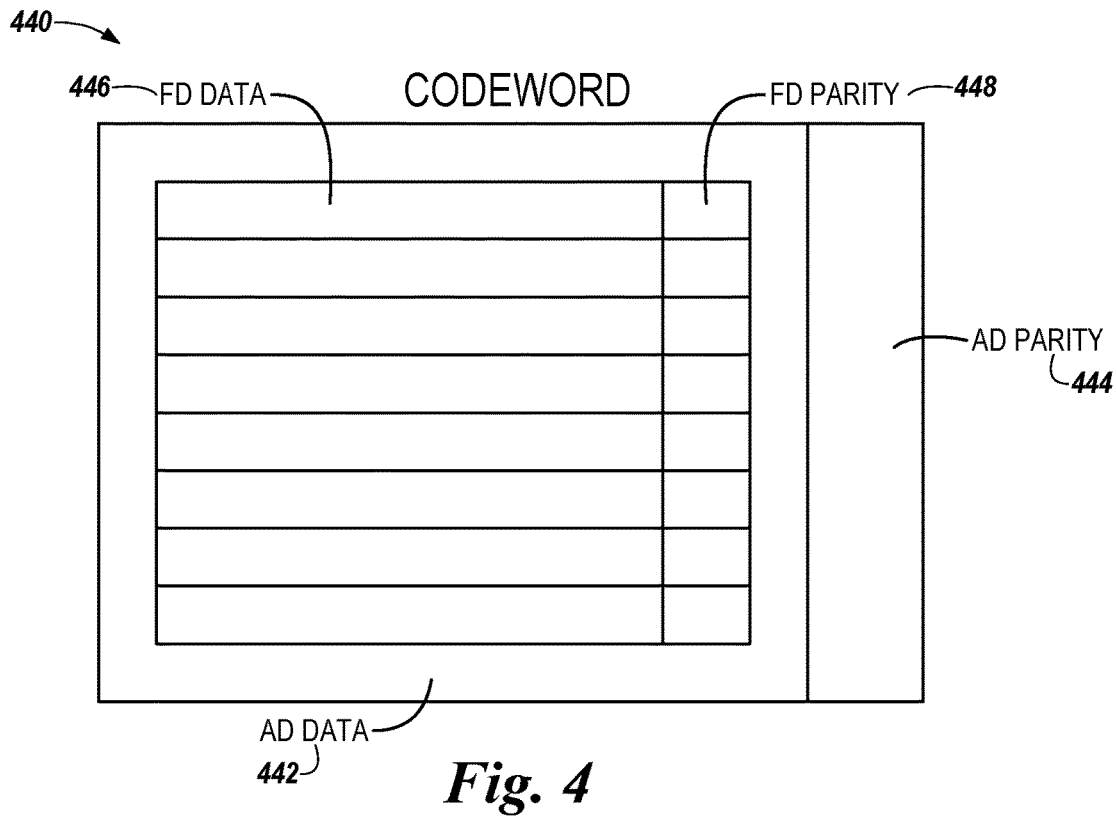
FIG. 4 illustrates an example of a codeword in accordance with a number of embodiments of the present disclosure.

FIG. 4 illustrates an example of a codeword 440 in accordance with a number of embodiments of the present disclosure. The codeword 440 includes AD data 442 and AD parity bits 444. The AD data 442 comprises FD data 446 and FD parity bits 448.

Before storing the data in the memory device (e.g., memory device 304), an outer encoder (e.g., outer encoder 306), acting on chunks of data (e.g., chunks of FD data 446), encodes each of the chunks of FD data 446 in FD codewords by adding FD parity bits 448 corresponding to each of the chunks. That is, the chunks of FD data 446 are sequentially encoded into N FD codewords comprising FD data 446 and FD parity bits 448.

The N FD codewords are encoded into N AD codewords by the inner encoder (e.g., inner encoder 308). The inner encoder processes the N FD codewords as AD data 442, where each of the chunks of AD data 442 is a difference codeword from the N FD codewords. The inner encoder generates AD parity bits 444 for each of the chunks of AD data 442. The AD parity bits 444 depend on the FD parity bits 448.

In a decoding phase, the FD codewords are tentatively decoded by an FD decoder. If the FD codewords are correctly decoded (e.g., if the FD codewords have no errors or a number of errors are corrected), then a validity flag is set for all the FD codewords and the AD decoder is inhibited. If at least one of the FD codewords is not corrected by the FD decoder and the FD decoder detects the presence of an error, the AD decoder is activated and the AD decoder processes the FD codewords.

In some embodiments, the FD decoder is implemented in memory to decrease the latency associated with correcting errors in an FD decoder. The FD decoder can communicate with the AD decoder to request the AD decoder's participation to complete the decoding process. That is, the FD decoder can initiate the decoding process and the FD decoder can request that the AD decoder complete the decoding process via a validity flag. The validity flag can be used to alert the AD decoder that the data can be corrected and/or to activate the AD decoder.

In some examples, the serial concatenation scheme can be replicated with an inner AD decoder. Both the FE encoder and FD decoder can be implemented in a memory device to reduce latency. The FD decoder can provide parity bits and a validity flag to the AD decoder to allow the AD decoder to decode the data based on whether the FD decoder had previously decoded the data (e.g., corrected error in the data).

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
an array;
a first decoder coupled to the array and configured to:
receive input data from the memory array;
perform a plurality of operations associated with an error detection on the input data; and
provide, based on processing the input data, output data, a validation flag, and a plurality of parity bits to a second decoder hosted by a controller coupled to the memory device wherein the validation flag triggers or inhibits the second decoder.

2. The memory device of claim 1, wherein the first decoder is further configured to determine that the input data does not contain an error.

3. The memory device of claim 2, wherein the first decoder is further configured to provide the input data as the output data based on determining that the input data does not contain the error.

4. The memory device of claim 1, wherein the first decoder is further configured to determine that the input data contains an error.

5. The memory device of claim 4, wherein the first decoder is further configured to correct the error to generate the output data.

6. The memory device of claim 4, wherein the first decoder is further configured to pass the input data as the output data based on a determination not to correct the error.

7. The memory device of claim 4, wherein the validity flag describes whether the error is corrected in the output data.

8. The memory device of claim 1, wherein the plurality of parity bits is used to conduct the error detection.

9. The memory device of claim 1, wherein the first decoder and the second decoder are error-correcting code decoders.

10. The memory device of claim 1, wherein the decoder is a fast decoding (FD) decoder.

11. The memory device of claim 1, wherein the second decoder is an error-correcting code decoder.

12. The memory device of claim 1, wherein the second decoder is an accurate decoding (AD) decoder.

13. A controller coupled to a memory device, comprising:
an accurate decoding (AD) decoder hosted by the controller and configured to:
receive data, a validity flag, and parity bits from a first fast decoding (FD) decoder hosted by the memory device;
responsive to determining that the validity flag is a first value, provide the data and the parity bits to a second FD decoder;
responsive to determining that the validity flag is a second value:
perform error correction operations on the data using the parity bits;
provide the data as corrected and the parity bits to the second FD decoder; and
the second FD decoder hosted by the controller and configured to perform error correction on the data using the parity bits.

14. The controller of claim 13, wherein the AD decoder is further configured to receive corrected data if the validity flag comprises the first value.

15. The controller of claim 13, wherein the AD decoder is further configured to receive raw data if the validity flag comprises the second value.

16. The controller of claim 13, wherein the controller is a micro controller.

17. The controller of claim 13, wherein the AD decoder is an inner decoder and the second FD decoder is an outer decoder.

18. An apparatus, comprising:
a memory array, configured to store data and parity bits; and
a fast decoding (FD) decoder coupled to the memory array and configured to receive the data and the parity bits and comprising:
a syndrome computation unit configured to generate a syndrome from the data and the parity bits;
an error correction unit configured to:
perform an error correction code on the data using the syndrome and the parity bits to generate corrected data based on a determination to correct the data; and
provide at least one of the data and the corrected data to an accurate decoding (AD) decoder hosted by a controller; and
a miscorrection checker unit configured to:
generate a validity flag based on whether the error correction unit provides the data or the corrected data to the AD decoder; and
provide the validity flag to the AD decoder wherein the validation flag triggers or inhibits the AD decoder.

19. The apparatus of claim 18, wherein the miscorrection checker unit is further configured to generate the validity flag based on the syndrome provided by the syndrome computation unit.

20. The apparatus of claim 18, wherein the miscorrection checker unit is further configured to receive a message, from the error correction unit, describing whether the error correction unit provided the at least one of the data or the corrected data to the AD decoder.

21. The apparatus of claim 18, wherein FD decoder further comprises a parity bits line.

22. The apparatus of claim 21, wherein the FD decoder is further configured to provide the parity bits to the AD decoder based on a determination to provide the data to the AD decoder.

23. The apparatus of claim 22, wherein the FD decoder is further configured to provide the parity bits to the AD decoder based on a request to provide the parity bits.

24. A method for performing an error correction code using a fast decoding (FD) decoder, comprising:
   determining whether to perform, using the FD decoder hosted by a memory device, a first error correction code on a page;
   based on a determination to perform the first error correction:
      generating a corrected page from the page and parity bits; and
      generating a first validity flag;
      providing the first validity flag and the corrected page to an accurate decoding (AD) decoder hosted by a micro controller wherein the first validation flag inhibits the AD decoder; and
   based on a determination not to perform the first error correction code;
      generating a second validity flag;
      providing the second validity flag, the page, and the parity bits to the AD decoder hosted by the micro controller wherein the second validation flag triggers the AD decoder.

25. The method of claim 24, further comprising, based on receiving the second validity flag, performing a second error correction code on the page using the parity bits using the AD decoder hosted by the micro controller.

26. The method of claim 25, wherein the AD decoder utilizes sequential logic.

27. The method of claim 24, further comprising based on receiving the first validity flag, abstaining from performing a second error correction code on the page.

28. The method of claim 24, wherein the FD decoder utilizes algebraic decoding.

29. The method of claim 28, wherein the FD decoder utilizes combinatory logic.

* * * * *